United States Patent
Tanabe

(10) Patent No.: US 9,385,860 B2
(45) Date of Patent: Jul. 5, 2016

(54) FRACTIONAL PLL CIRCUIT

(71) Applicant: Jun Tanabe, Kanagawa (JP)

(72) Inventor: Jun Tanabe, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/701,639

(22) Filed: May 1, 2015

(65) Prior Publication Data

US 2015/0341163 A1  Nov. 26, 2015

(30) Foreign Application Priority Data

May 23, 2014 (JP) ................................. 2014-107302

(51) Int. Cl.
| | | |
|---|---|---|
| *H04B 1/707* | (2011.01) | |
| *H04L 7/033* | (2006.01) | |
| *H04B 1/7073* | (2011.01) | |
| *H03L 7/183* | (2006.01) | |
| *H03L 7/081* | (2006.01) | |

(52) U.S. Cl.
CPC .............. *H04L 7/0331* (2013.01); *H03L 7/081* (2013.01); *H03L 7/183* (2013.01); *H04B 1/7073* (2013.01)

(58) Field of Classification Search
USPC .................... 375/130, 220, 376; 327/157, 156
See application file for complete search history.

(56) References Cited

U.S. PATENT DOCUMENTS

| | | | | |
|---|---|---|---|---|
| 8,773,183 | B2 * | 7/2014 | Watabe | H03L 7/081 327/147 |
| 9,019,016 | B2 * | 4/2015 | Ichihara | H03L 7/085 327/156 |
| 2011/0193601 | A1 * | 8/2011 | Albasini | H03L 7/0891 327/156 |
| 2011/0304367 | A1 * | 12/2011 | Oh | H03L 7/102 327/157 |
| 2011/0310942 | A1 * | 12/2011 | Flynn | H03L 7/081 375/220 |
| 2014/0002151 | A1 | 1/2014 | Watabe et al. | |
| 2014/0327478 | A1 * | 11/2014 | Horng | H03L 7/08 327/157 |

FOREIGN PATENT DOCUMENTS

JP  2012-195824  10/2012

\* cited by examiner

*Primary Examiner* — Eva Puente
(74) *Attorney, Agent, or Firm* — Cooper & Dunham LLP

(57) ABSTRACT

A fractional PLL circuit includes a phase comparator, a voltage-controlled oscillation unit, a phase-selection unit equally dividing a period of an output-clock signal output from the voltage-controlled oscillation unit into a predetermined number of phases, selecting one of the phases, and generating a phase-shift clock signal having a rising edge in the selected phase, a frequency-divider unit dividing a frequency of the phase-shift clock signal and outputting the divided signal to the phase comparator, and a phase-control unit determining the phase to be selected for changing a duration of a period of the phase-shift clock signal by a predetermined phase-shift amount and controlling the phase-selection unit. The phase-control unit operates with the frequency-divided phase-shift clock signal.

3 Claims, 10 Drawing Sheets

… (US 9,385,860 B2)

FRACTIONAL PLL CIRCUIT

CROSS-REFERENCE TO RELATED APPLICATION

The present application is based on and claims priority from Japanese Patent Application No. 2014-107302, filed on May 23, 2014, the disclosure of which is hereby incorporated by reference herein in its entirety.

BACKGROUND

1. Technical Field

The present invention relates to a fractional Phase Locked Loop (PLL) circuit having a rational number frequency-division ratio.

2. Description of Related Art

Conventionally, a spread spectrum clock generator (SSCG) has been used in high-speed serial communication to prevent a radiated electromagnetic interference. The spread spectrum clock generator is configured to include a fractional PLL circuit having a rational number frequency division ratio.

Generally, the fractional PLL circuit includes a phase frequency comparator, a charge pump, a loop filter, a voltage-controlled oscillator (VCO), a phase controller, a phase selection circuit, and a frequency divider.

In the art of the fractional PLL circuit, it has been tried to reduce a jitter in an output-clock signal by changing a phase of a clock pulse through the phase controller and the phase selection circuit (refer to Patent Document 1: JP2012-195824A).

However, the above-described conventional fractional PLL circuit has a problem. The phase controller of the conventional fractional PLL circuit operates at an oscillating frequency of the voltage-controlled oscillator. However, depending on the processing ability of the phase controller, the phase controller cannot operate properly when the oscillating frequency is too high.

In addition, the processing speed of the phase controller cannot meet the oscillating frequency of the voltage-controlled oscillator when the phase controller and the phase selection circuit exchange data therebetween in synchronization with the oscillating frequency of the voltage-controlled oscillator.

It is difficult to reduce the jitter in the output-clock signal when the processing speed of the phase controller cannot meet the oscillating frequency of the voltage-controlled oscillator.

SUMMARY

The present invention aims to provide a fractional PLL circuit which regulates the processing speed of the phase controller to meet the oscillating frequency of a voltage-controlled oscillator to reduce the jitter even in a case where the oscillating frequency is high.

In order to solve the above-described problems, aspects of the present invention includes a fractional PLL circuit including a phase comparator that detects a phase difference between an input clock signal as a reference and a feedback signal, and outputs a control voltage according to the phase difference, a voltage-controlled oscillation unit that generates and outputs an output-clock signal having a frequency according to the control voltage, a phase-selection unit that equally divides a period of the output-clock signal into a predetermined number of phases, selects one of the phases, and generates a phase-shift clock signal having a rising edge in the selected phase, a frequency-divider unit that divides a frequency of the phase-shift clock signal, and outputs the frequency-divided phase-shift clock signal to the phase comparator as the feedback signal, and a phase-control unit that determines the phase to be selected by the phase-selection unit for changing a duration of a period of the phase-shift clock signal from a duration of the period of the output-clock signal by a predetermined phase-shift amount, the phase-control unit that controls the phase-selection unit to select the determined phase. The phase-control unit operates with the frequency-divided phase-shift clock signal.

DETAILED DESCRIPTION

Hereinafter, embodiments of the present invention will be described with reference to the drawings.

Embodiment 1

Figure 1:
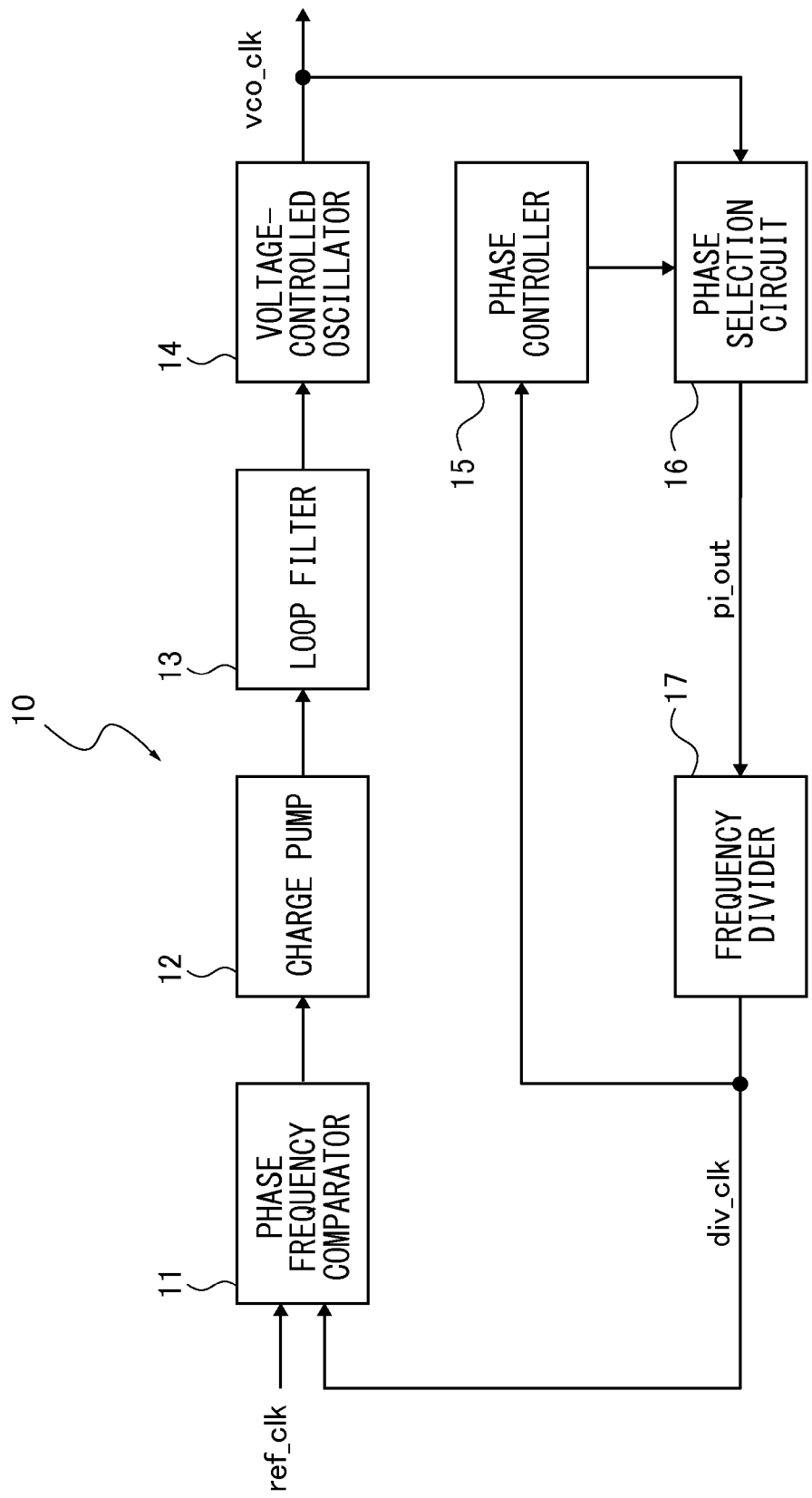
FIG. 1 is a block diagram illustrating an entire arrangement of a fractional PLL circuit according to an embodiment 1.

FIG. 1 is a block diagram illustrating an entire arrangement of a fractional PLL circuit 10 according to an embodiment 1. The fractional PLL circuit 10 includes a phase frequency comparator 11, a charge pump 12, a loop filter 13, a voltage-controlled oscillator (VCO) 14, a phase controller 15, a phase selection circuit 16, and a frequency divider 17.

An input-clock signal ref_clk as a reference clock signal generated by a not-shown reference-clock generator and a feedback signal from the frequency divider 17 are input to the phase frequency comparator 11. Then, the phase frequency comparator 11 detects a phase difference between the two input signals, and outputs the phase difference to the charge pump 12. The charge pump 12 outputs a charge-pump voltage to the loop filter 13. The charge-pump voltage is increased or decreased according to the phase difference. The loop filter 13 outputs a control voltage according to the charge-pump voltage to the voltage-controlled oscillator 14. The voltage-controlled oscillator 14 generates and outputs an output-clock signal vco_clk having a frequency and a phase corresponding to the control voltage.

The phase selection circuit 16 equally divides one period of the output-clock signal vco_clk of the voltage-controlled oscillator 14 into a predetermined number, and selects one of the phases. Then, the phase selection circuit 16 generates a phase-shift clock signal pi_out having the selected phase. The frequency divider 17 divides a frequency of the phase-shift clock signal pi_out generated by the phase selection circuit 16. Thereby, a phase-shift clock signal div_clk is generated. The phase-shift clock signal div_clk is input to the phase frequency comparator 11 as the feedback signal.

The phase controller 15 determines the phase to be selected by the phase selection circuit 16 for changing duration of a period of the phase-shift clock signal pi_out from the duration of the period of the output-clock signal vco_clk of the voltage-controlled oscillator 14 by a predetermined phase-shift amount. Then, the phase controller 15 controls the phase selection circuit 16 to select the determined phase. In addition, the phase controller 15 synchronously operates with the frequency of the phase-shift clock signal div_clk. Therefore, the phase controller 15 needs a processing speed at the frequency of the phase-shift clock signal div_clk.

In the embodiment 1, the phase-shift clock signal div_clk the frequency of which is divided by the frequency divider 17 is input to the phase controller 15, and the phase controller 15 operates with the phase-shift clock signal div_clk.

The processing speed of the phase controller 15 is reduced by increasing a frequency-division ratio of the frequency divider 17. Therefore, a processing speed of the fractional PLL circuit can be improved even in a circuit in which the output-clock signal vco_clk of the voltage-controlled oscillator 14 has a high-speed.

In addition, according to the arrangement shown in FIG. 1, the jitter in the output-clock signal vco_clk of the voltage-controlled oscillator 14 can be reduced since the frequency-division ratio of the frequency divider 17 is constant.

In the embodiment 1, the phase frequency comparator 11 configures a phase comparator, the voltage-controlled oscillator 14 configures a voltage-controlled oscillation unit, a phase controller 15 configures a phase-control unit, the phase selection circuit 16 configures a phase-selection unit, and the frequency divider 17 configures a frequency-divider unit.

Figure 2:
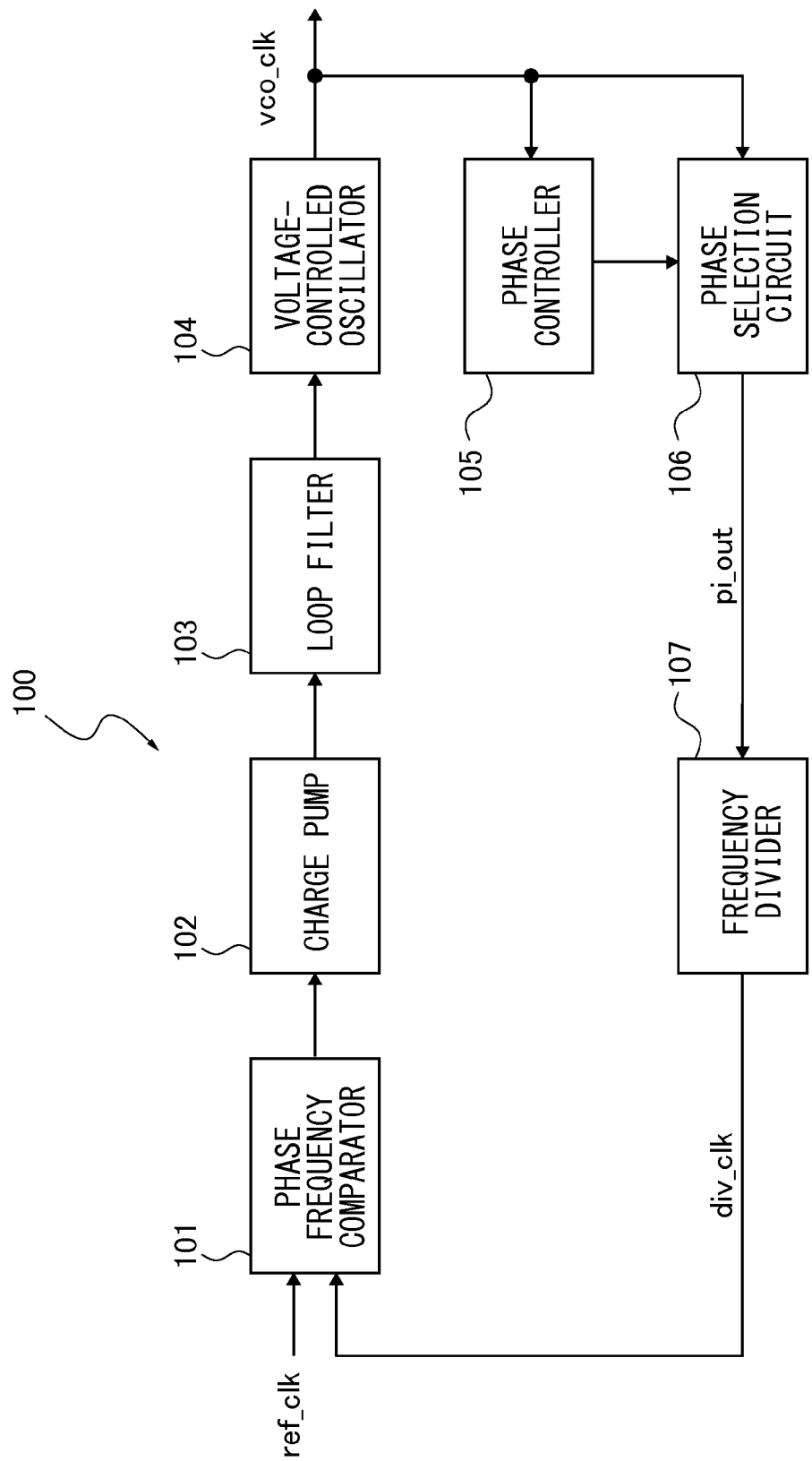
FIG. 2 is a block diagram illustrating an entire arrangement of a conventional fractional PLL circuit.

FIG. 2 illustrates an entire arrangement of a conventional fractional PLL circuit 100 for comparison. The conventional fractional PLL circuit 100 similarly includes a phase frequency comparator 101, a charge pump 102, a loop filter 103, a voltage-controlled oscillator 104, a phase controller 105, a phase selection circuit 106, and a frequency divider 107.

In the arrangement shown in FIG. 2, the jitter in the output-clock signal vco_clk of the voltage-controlled oscillator 104 can also be reduced since the frequency-division ratio of the frequency divider 107 is constant.

Figure 3:
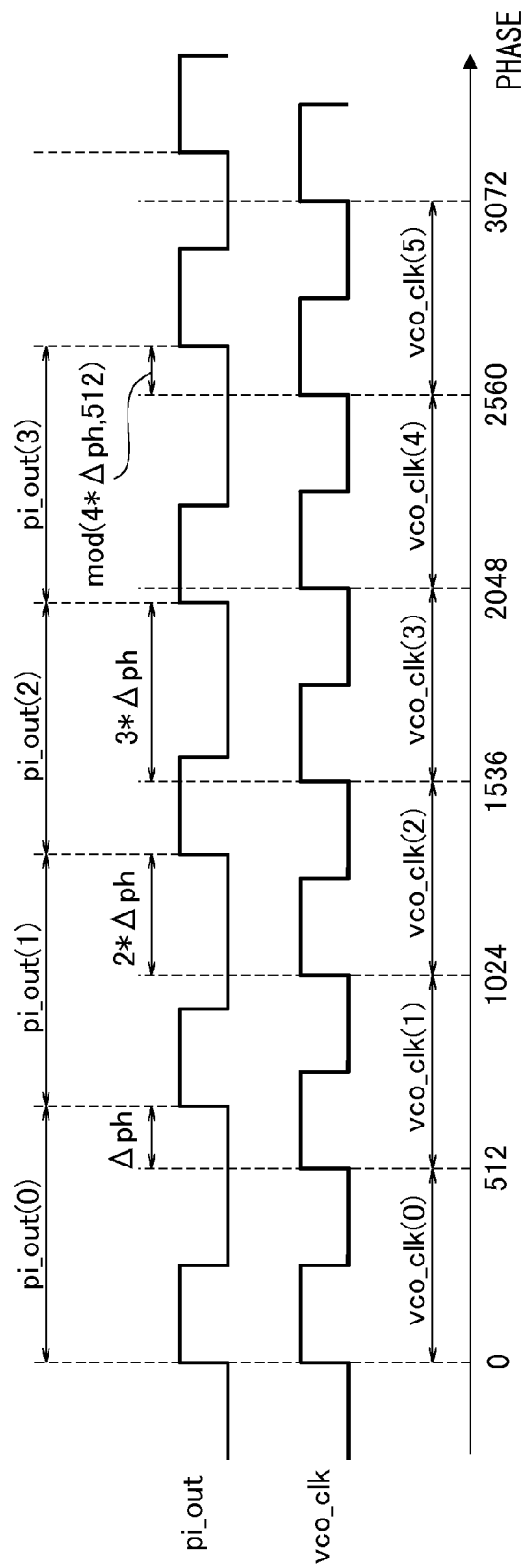
FIG. 3 is a timing chart illustrating phase-shift operation performed by a phase selection circuit shown in FIG. 2 when a phase-shift amount is positive.

FIG. 3 illustrates phase-shift operation performed by the phase selection circuit 106 shown in FIG. 2. FIG. 3 is a timing chart when a phase shift amount Δph is positive. In FIG. 3, a unit applied to the horizontal axis represents a phase of the output-clock signal vco_clk the period of which is equally divided into 512 phases.

The duration of the period of the phase-shift clock signal pi_out increases from the period of the output-clock signal vco_clk by the phase-shift amount Δph so as to be 512+Δph. This means that the rising edge of the phase-shift clock signal pi_out delays from the rising edge of the corresponding output-clock signal vco_clk by the increment of the phase-shift amount Δph every period of the clock pulse.

The rising edge of the first clock vco_clk (0) of the output-clock signal and the rising edge of the first clock pi_out (0) of the phase-shift clock signal are on the same timing. The rising edge of the second clock pi_out (1) of the phase-shift clock signal delays from the rising edge of the second clock vco_clk (1) of the output-clock signal by the phase-shift amount Δph. The rising edge of the third clock pi_out (2) of the phase-shift clock signal delays from the rising edge of the third clock vco_clk (2) of the output-clock signal by twice as much as the phase-shift amount Δph.

Thereafter, the rising edge of the nth clock pi_out (n−1) of the phase-shift clock signal delays from the rising edge of the nth clock vco_clk (n−1) of the output-clock signal by (n−1) times as much as the phase-shift amount Δph.

Figure 4:
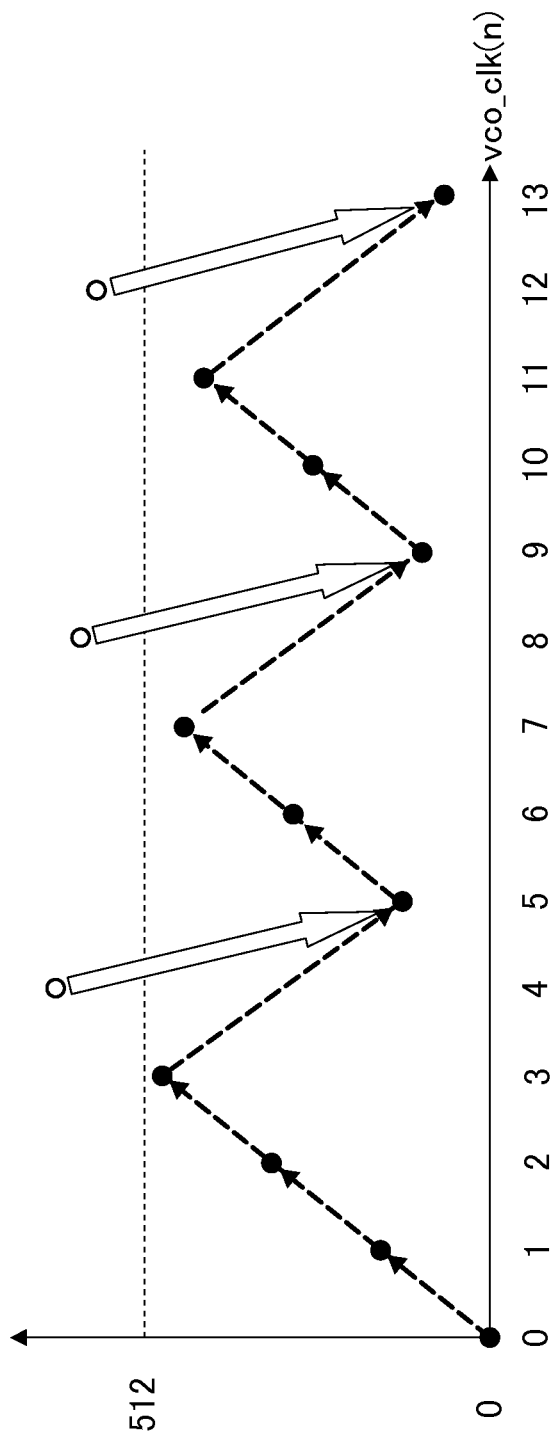
FIG. 4 illustrates a phase to be selected by the phase selection circuit when the phase-shift operation shown in FIG. 3 is performed.

FIG. 4 illustrates the phase to be selected by the phase selection circuit 106 when the phase-shift operation shown in FIG. 3 is performed. The phase selection circuit 106 equally divides one period of the output-clock signal vco_clk, and selects one of the phases 0 to 511 as the present phase.

The phase selection circuit 106 selects the phase which is incremented by the phase-shift amount Δph every period of the output-clock signal vco_clk as the new present phase. When a sum of the present phase and the phase-shift amount Δph is less than one period of the output-clock signal vco_clk despite the increment of the phase-shift amount Δph, which means that, when the phase after the increment is equal to or less than 511, the rising edge of the next clock pulse of the phase-shift clock signal pi_out is in the corresponding phase in the next period of the output-clock signal vco_clk.

On the other hand, when a sum of the present phase and the phase-shift amount Δph becomes equal to or greater than one period of the output-clock signal vco_clk through the increment of the phase-shift amount Δph, which means that, when the phase after the increment is equal to or greater than 512, the rising edge of the next phase-shift clock signal pi_out is not in the phase of the next output clock vco_clk but in the phase that is subtracted 512 from the incremented phase in the period of the clock pulse after the next output-clock signal vco_clk.

In the latter case as above, as shown in FIG. 3 for example, the rising edge of the fifth clock pi_out (4) of the phase-shift clock signal is not in the period of the fifth clock vco_clk (4) of the output-clock signal but in the period of the sixth clock vco_clk (5) of the output-clock signal. The rising edge of the fifth clock pi_out (4) of the phase-shift clock signal delays by mod (4×Δph, 512), namely, the rising edge of the fifth clock pi_out (4) delays from the rising edge of the sixth clock vco_clk (5) of the output-clock signal by the remainder of Δph multiplied by 4 and divided by 512. This is illustrated with an outlined arrow in FIG. 4. In FIG. 4, instead of selecting the phase indicated by the filled circle representing the output-clock signal vco_clk (4), vco_clk (8), and vco_clk (12) on the dotted line, the phase indicated by the solid-open circle in the next clock is selected.

By selecting the phase as described with reference to FIG. 3 and FIG. 4, the duration of the period of each pi_out (0), pi_out (1), . . . , pi_out (n) of the phase-shift clock signal is constantly increased from the duration of the period of the output-clock signal vco_clk by the phase-shift amount Δph, which means the duration of the period of the phase-shift clock signal pi_out becomes 512+Δph.

Figure 5:
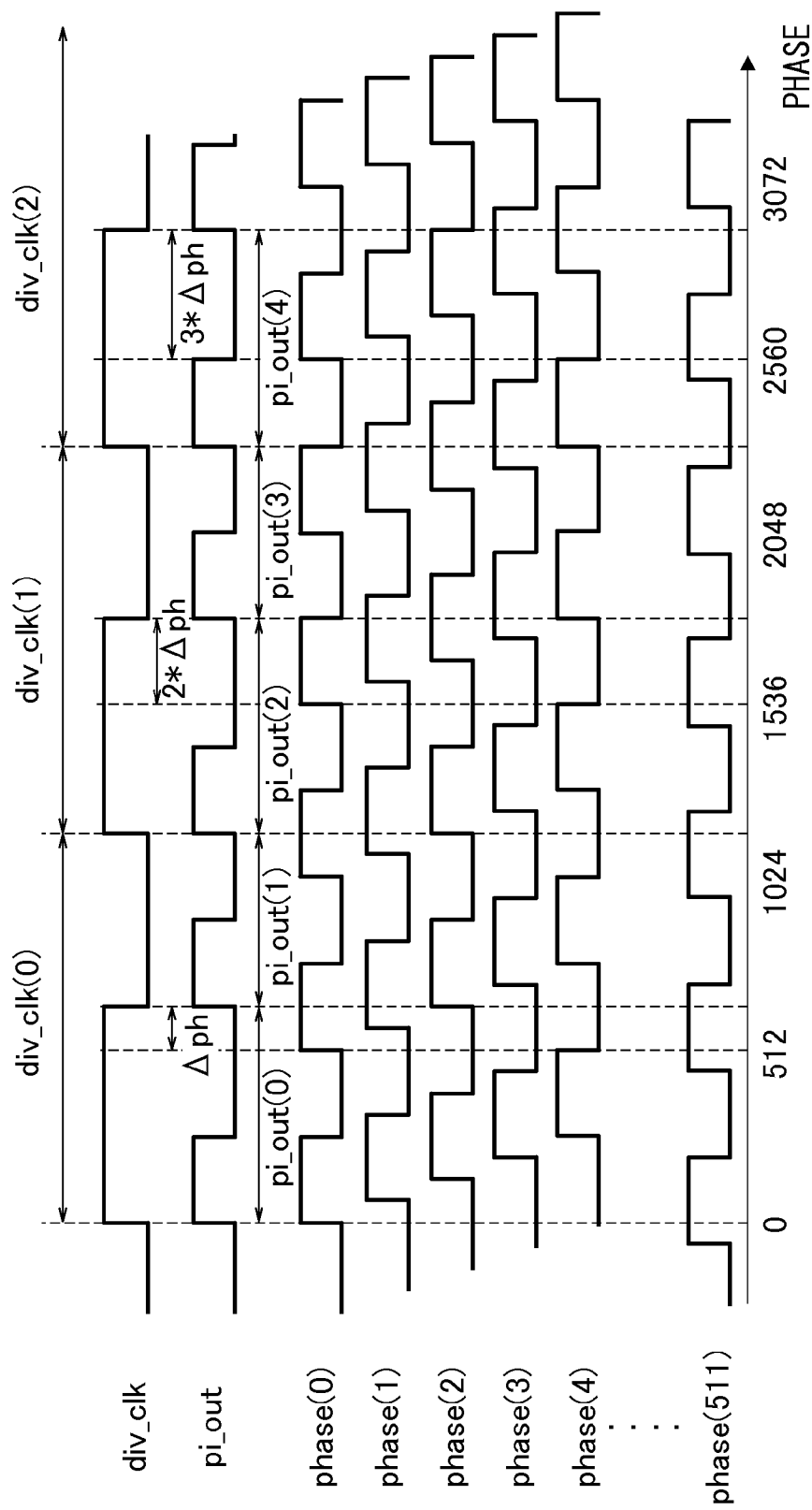
FIG. 5 is a timing chart illustrating phase-shift operation performed by a phase selection circuit shown in FIG. 1 when a phase-shift amount is positive.

FIG. 5 illustrates the phase-shift operation performed by the phase selection circuit 16 shown in FIG. 1. FIG. 5 is a timing chart when the phase-shift amount Δph is positive. In FIG. 5, a unit applied to the horizontal axis represents the phase of the output-clock signal vco_clk the period of which is equally divided into 512 phases. The phase (n), which means the phase (0) to the phase (511), represents the clock pulse having one of the 512 divided phases.

The phase-shift clock signal div_clk shown in FIG. 5 represents a waveform in a case where the frequency-division ratio of the frequency divider 17 is set to be 2. The phase-shift clock signal div_clk has half the frequency of the phase-shift clock signal pi_out.

The period of the phase-shift clock signal pi_out is increased by the phase-shift amount Δph from the period of the output-clock signal vco_clk, and becomes 512+Δph. Namely, the rising edge of the phase-shift clock signal pi_out delays from the rising edge of the corresponding output-clock signal vco_clk by the phase-shift amount Δph every period of the phase-shift clock signal div_clk.

In the case shown in FIG. 5, the duration of the Δph is equal to 2/512 phases, which means the duration of the two phases of 512 divided phases. The rising edge of the phase-shift clock signal pi_out delays by two phases, such as from the phase (0) to the phase (2), every period of the phase-shift clock signal div_clk. The period of the phase-shift clock signal div_clk is equal to the period of the output clock signal vco_clk multiplied by two plus Δph.

Figure 6:
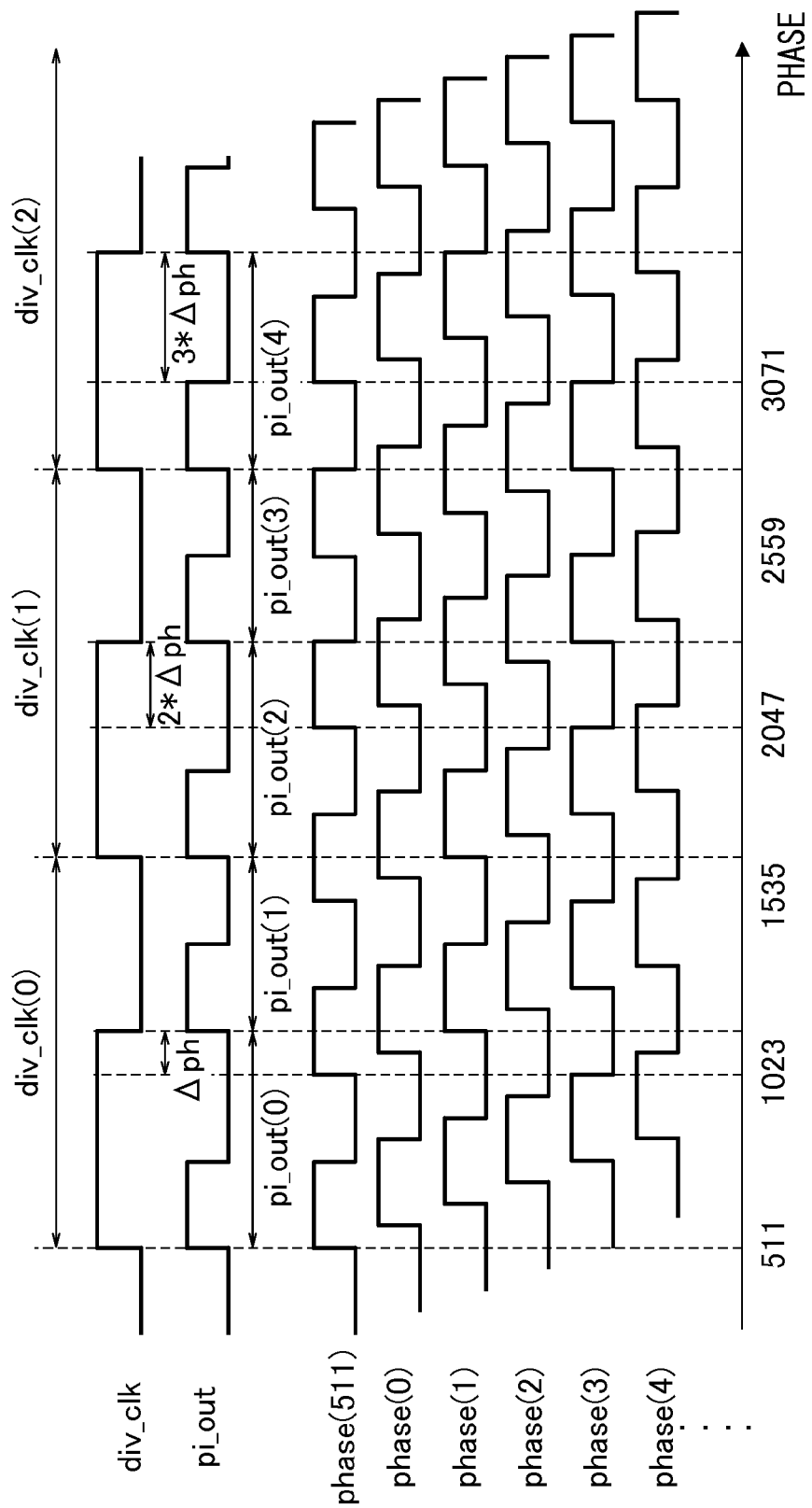
FIG. 6 is a timing chart, similar to FIG. 5, illustrating phase-shift operation performed by the phase selection circuit shown in FIG. 1 when a phase-shift amount is positive.

Similar to FIG. 5, FIG. 6 illustrates the phase-shift operation performed by the phase selection circuit 16 in FIG. 1. FIG. 6 is a timing chart when the phase-shift amount Δph is positive. In FIG. 6, a unit applied to the horizontal axis represents the phase of the output-clock signal vco_clk the period of which is equally divided into 512 phases. The phase (n) represents the clock pulse having one of the 512 divided phases.

A differential between FIG. 6 and FIG. 5 is a part where the phase shifts from the phase (511) to the phase (0). As explained above, the conventional phase controller 105 synchronously operates with the output-clock signal vco_clk. As a result, the conventional phase controller 105 had to skip a process outputting a clock pulse corresponding to the output clock signals vco_clk (4), vco_clk (8), vco_clk (12), etc., as explained with reference to FIG. 4. On the other hand, the phase controller 15 of the embodiment 1 synchronously operates with the phase-shift clock signal div_clk, instead of the output clock signal vco_clk. Therefore, the phase controller 15 does not need such a process.

Figure 7:
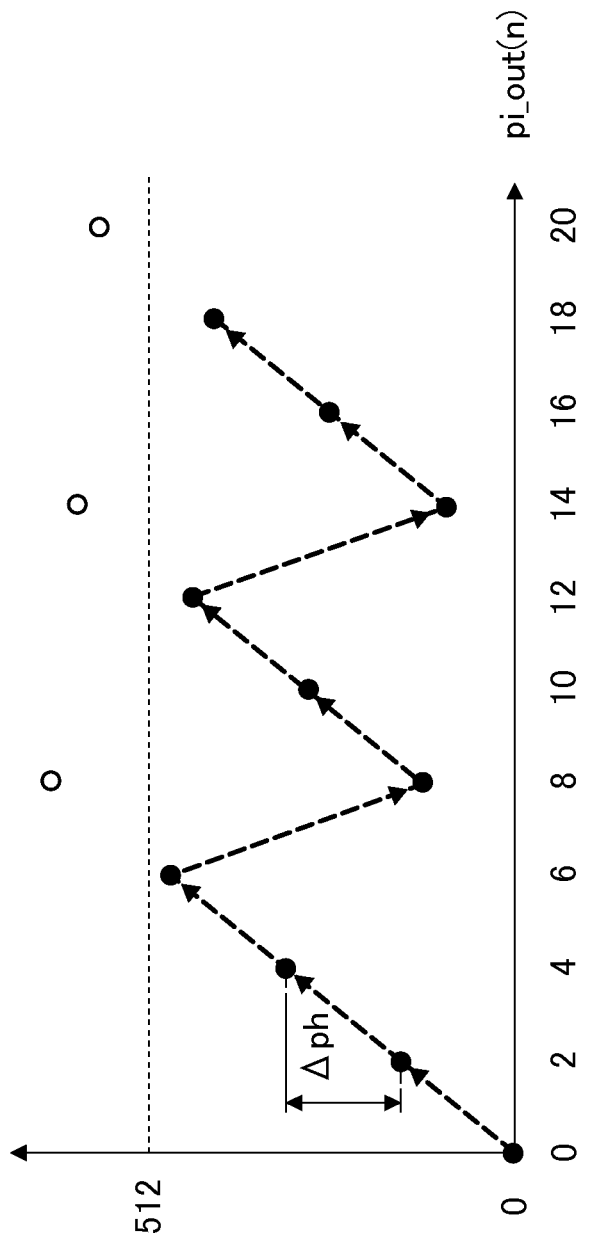
FIG. 7 illustrates a phase to be selected by the phase selection circuit when the phase-shift operation shown in FIG. 5 is performed.

FIG. 7 illustrates the phase to be selected by the phase selection circuit 16 when the phase-shift operation shown in FIG. 5 is performed. The phase selection circuit 16 equally divides one period of the output-clock signal vco_clk, and selects one of the phases 0 to 511 as the present phase.

In this instance, since the frequency-division ratio is set to be 2, the phase selection circuit 16 selects the phase incremented by the phase-shift amount Δph as a new present phase every two periods of the phase-shift clock signals pi_out.

Contrary to the conventional process, since the phase controller 15 synchronously operates with the phase-shift clock signal pi_out, a term in which the clock pulse is not output is not generated. Therefore, the phase controller 15 can be configured to operate more simply.

Figure 8:
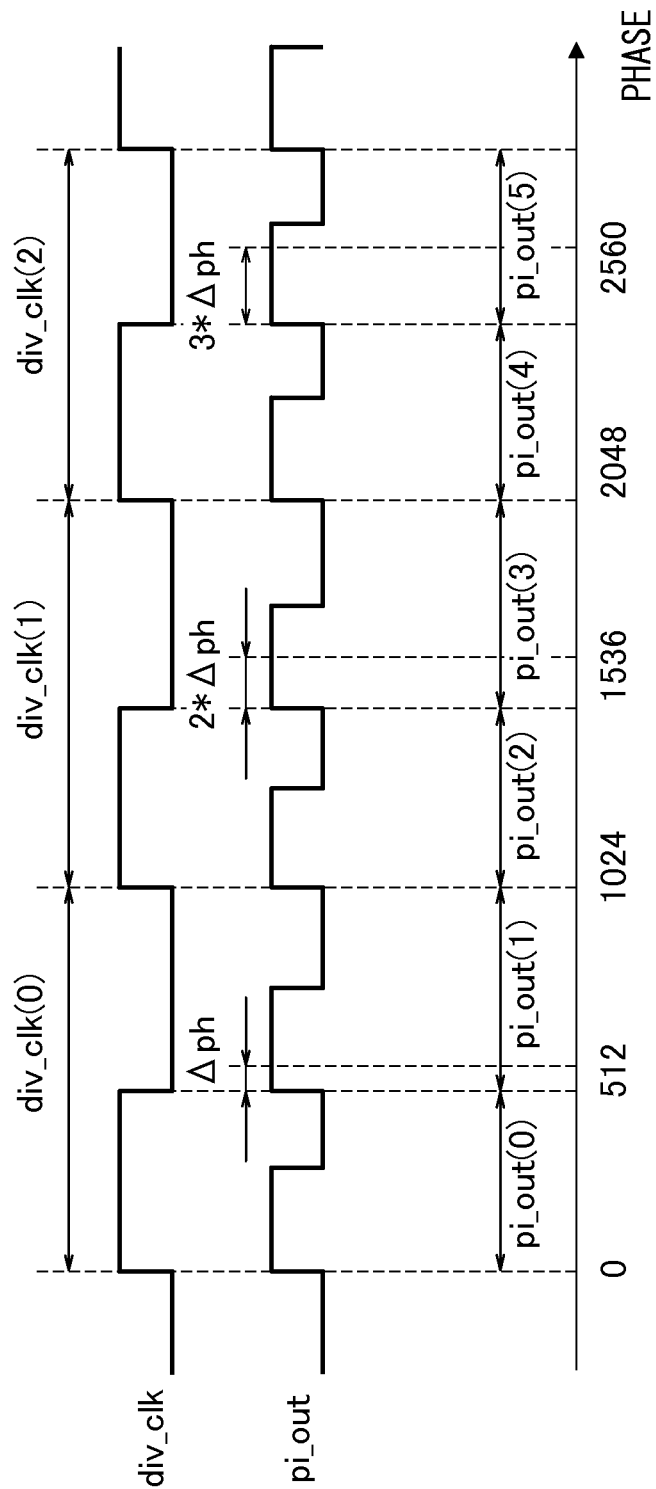
FIG. 8 is a timing chart illustrating phase-shift operation performed by the phase selection circuit shown in FIG. 1 when a phase-shift amount is negative.

FIG. 8 illustrates the phase-shift operation performed by the phase selection circuit 16 in FIG. 1. FIG. 8 is a timing chart when the phase-shift amount Δph is negative. In FIG. 8, a unit applied to the horizontal axis represents the phase of the output-clock signal vco_clk the period of which is equally divided into 512 phases. The phase (n) represents the clock pulse having one of the 512 divided phases.

The phase-shift clock signal div_clk in FIG. 8 represents the waveform when the frequency-division ratio of the frequency divider 17 is set to be 2. The phase-shift clock signal div_clk has half the frequency of the phase-shift clock signal pi_out.

The duration of the period of the phase-shift clock signal pi_out is shorter than the period of the output-clock signal vco_clk by the phase-shift amount Δph, which means 512−Δph. Namely, the rising edge of the phase-shift clock signal pi_out advances the rising edge of the corresponding output clock signal vco_clk by the phase-shift amount Δph every period of the clock pulse.

In the case shown in FIG. 8, the duration of the Δph is equal to 2/512 phases, which means equal to the duration of the two phases of 512 divided phases. The rising edge of the phase-shift clock signal pi_out advances by two phases, such as from the phase (0) to the phase (2), every period of the phase-shift clock signal div_clk. The period of the phase-shift clock signal div_clk is obtained by multiplying the period of the vco_clk by two minus Δph.

Figure 9:
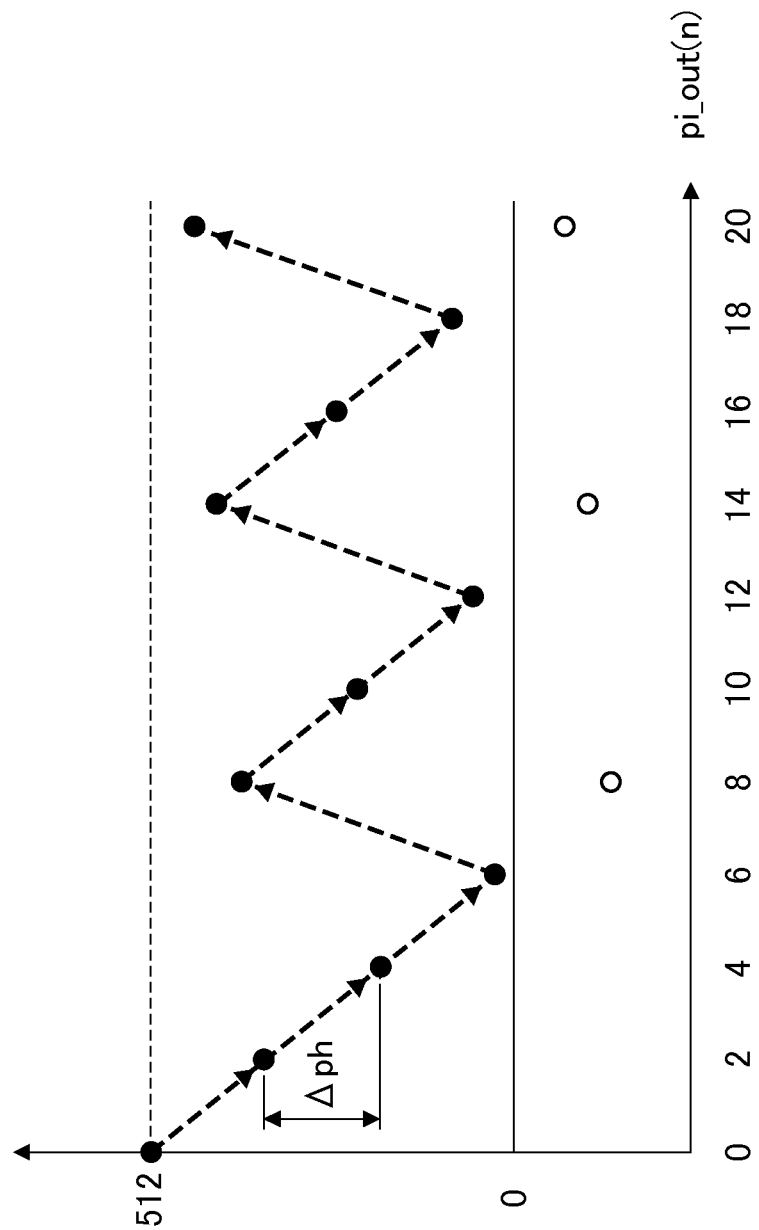
FIG. 9 illustrates a phase to be selected by the phase selection circuit when the phase-shift operation shown in FIG. 8 is performed.

FIG. 9 illustrates the phase to be selected by the phase selection circuit 16 when the phase-shift operation shown in FIG. 8 is performed. The phase selection circuit 16 equally divides one period of the output clock signal vco_clk into 512 phases, and selects one of the phases 0 to 511 as the present phase.

In this instance, since the frequency-division ratio is set to be 2, the phase selection circuit 16 selects the phase that is decremented by the phase-shift amount Δph as the new present phase every two periods of the phase-shift clock signal pi_out.

Since the phase controller 15 synchronously operates with the phase-shift clock signal pi_out, the term in which the clock pulse is not output is not generated contrary to the conventional process. The operational state of the phase controller 15 is not changed in both cases when the phase-shift amount Δph is positive and when the phase-shift amount Δph is negative. Therefore, the phase controller 15 can be configured much simpler.

According to the embodiment 1 of the present invention, since the phase controller 15 does not operate at the oscillating frequency of the voltage-controlled oscillator 14 but operates at the oscillating frequency of the frequency-divided clock pulse having a lower frequency compared with the oscillating frequency of the voltage-controlled oscillator 14, such a situation in which the processing speed of the phase controller 15 fails to meet the oscillating frequency of the voltage-controlled oscillator 14 can be avoided. As a result, the processing speed of the fractional PLL circuit can be improved, and the jitter can be reduced.

Embodiment 2

Figure 10:
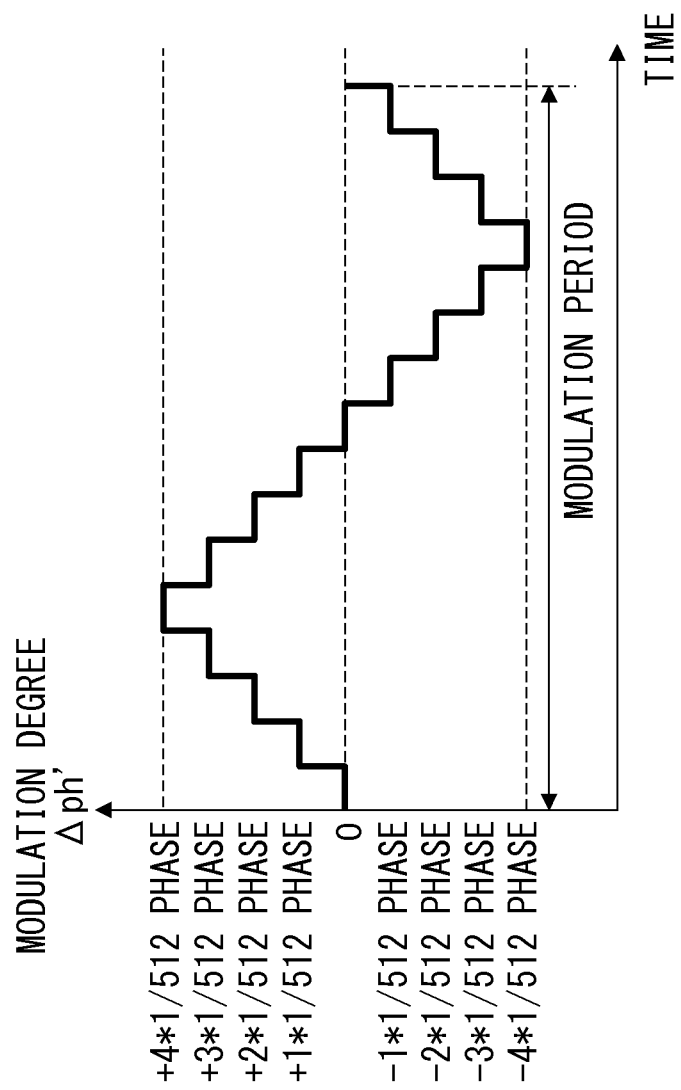
FIG. 10 illustrates an aspect of an embodiment 2, and shows an operation of a spread-spectrum-clock generator (SSCG) incorporating the fractional PLL circuit according to the embodiment 1.

FIG. 10 illustrates an aspect according to an embodiment 2, and illustrates an operation of a spread spectrum clock generator (SSCG) incorporating the fractional PLL circuit of the embodiment 1.

In FIG. 10, the horizontal axis represents a time, and the vertical axis represents a modulation degree αph'. By increasing or decreasing the modulation degree Δph' every period of modulation, the spread spectrum clock generator can be operated.

The operation shown in FIG. 5 and FIG. 6 corresponds to a case in which the modulation degree Δph' is +2*1/512. When the modulation degree Δph' is 0, the phase-modulation control is not commanded, and the operational phase remains in the phase (0).

According to the embodiment 2, even when the oscillating frequency of the voltage-controller oscillator 14 is high, the spread spectrum clock generator (SSCG) can be configured.

Although the present invention is described in terms of exemplary in the embodiments with reference to the figures as described above, it is not limited thereto. It should be appreciated that variations or modifications may be made in the embodiments without departing from the scope of the present invention as defined by the following claims.

What is claimed is:

1. A fractional PLL circuit comprising:
    a phase comparator that detects a phase difference between an input clock signal as a reference and a feedback signal, and outputs a control voltage according to the phase difference;
    a voltage-controlled oscillation unit that generates and outputs an output-clock signal having a frequency according to the control voltage;
    a phase-selection unit that equally divides a period of the output-clock signal into a predetermined number of phases, selects one of the phases, and generates a phase-shift clock signal having a rising edge in the selected phase;
    a frequency-divider unit that divides a frequency of the phase-shift clock signal, and outputs the frequency-divided phase-shift clock signal to the phase comparator as the feedback signal; and
    a phase-control unit that determines the phase to be selected by the phase-selection unit for changing a duration of a period of the phase-shift clock signal from a duration of the period of the output-clock signal by a predetermined phase-shift amount, the phase-control unit that controls the phase-selection unit to select the determined phase,
    wherein the phase-control unit receives the frequency-divided phase-shift clock signal and operates according to the frequency-divided phase-shift clock signal.

2. A spread spectrum clock generator comprising the fractional PLL circuit according to claim 1.

3. A frictional PLL circuit according to claim 1, wherein the phase-control unit synchronously operates with the frequency-divided phase-shift clock signal.

* * * * *